(12) United States Patent
Szydlowski

(10) Patent No.: US 6,246,042 B1
(45) Date of Patent: *Jun. 12, 2001

(54) LAYOUT OF ACTIVE PIXELS HAVING SHARED SIGNAL LINES

(75) Inventor: Craig P. Szydlowski, Gilbert, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,542

(22) Filed: Jan. 8, 1998

(51) Int. Cl.[7] ................................................. H01L 27/00
(52) U.S. Cl. ....................................... 250/208.1; 250/214 R
(58) Field of Search ........................... 250/208.1, 214 R, 250/214 LS; 348/302, 307–310; 257/443–445

(56) References Cited

U.S. PATENT DOCUMENTS

| 5,471,515 | 11/1995 | Fossum et al. ................ 377/60 |
| 5,721,422 | * 2/1998 | Bird ............................... 250/208.1 |
| 5,812,192 | * 9/1998 | Ishigami et al. ............... 348/321 |

\* cited by examiner

Primary Examiner—Que T. Le
(74) Attorney, Agent, or Firm—Blakely, Sokoloff, Taylor & Zafman LLP

(57) ABSTRACT

A pixel array including a first pixel having side portions and a pixel, wherein the pixel array includes a second pixel adjacent to the first pixel, the second pixel having a second pixel layout configured to substantially mirror the first pixel layout about one of the side portions of the first pixel.

8 Claims, 10 Drawing Sheets

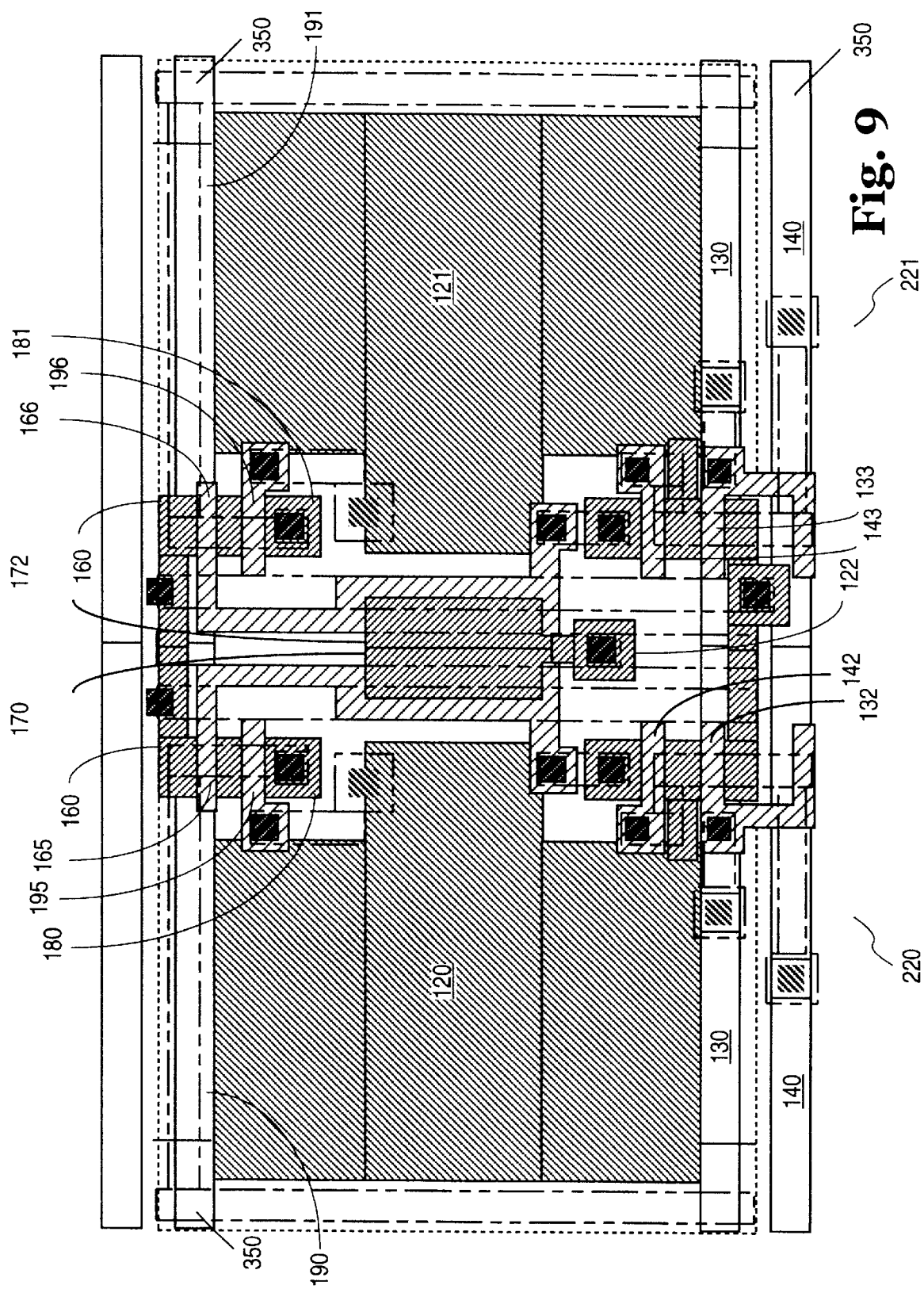

LAYOUT OF ACTIVE PIXELS HAVING SHARED SIGNAL LINES

BACKGROUND OF THE INVENTION

1. Field of the Invention

The invention relates to digital imaging devices and more particularly to digital pixel configuration.

2. Description of Related Art

Imaging sensing devices are the light detecting component in digital imaging systems, such as for example, digital cameras. An image sensing device, such as a camera, uses light to capture an image by a semiconductor-based chip. The chip replaces film in traditional film-based systems. In a camera, an image sensing device is configured, in its simplest form, to capture a monochrome or color image by way of semiconductor devices such as transistors, capacitors, and photodiodes. In one example, the image sensing device is a chip made up of a number of pixels, each pixel capable of absorbing light. In color applications, each pixel generally absorbs light through a filter and represents one color corresponding to the image sensed.

In general, a pixel contains a photosensing structure, such as a photodiode, and other pixel circuitry. The photosensing structure is the region of the pixel that responds to light. For example, a pixel circuit having a photodiode is charged to, for example, 5 volts. The photodiode is exposed to light and the pixel circuit discharges its stored energy depending on the intensity of the light exposure.

FIG. 1 illustrates an example of a prior art pixel circuit 10 described in U.S. Pat. No. 5,471,515. Prior art pixel circuit 10 contains a photosensing structure 20, such as for example, a photodiode that is sensitive to light. The circuit also contains a SAMPLE capacitor 70. SAMPLE capacitor 70 is initially charged to, for example, 5 volts by connecting the circuit to $V_{CCT}$ 50 which is the source connection of transistor M1 through transistor M2. Pixel circuit 10 also includes a RESET signal 30 that is coupled to the gate of transistor M1 that charges diode 20 when desired. Pixel circuit 10 contains a SAMPLE signal 40 coupled to the gate of transistor M2. SAMPLE signal 40 regulates the amount of time that photodiode 20 is permitted to be exposed. In other words, SAMPLE signal 40 regulates the discharge time of capacitor 70 according to, for example, the light exposure. Pixel circuit 10 further contains a driver, represented by transistor M3, which receives power from $V_{CC}$ 60 to take the signal from pixel circuit 10 and drive it off the chip to other process circuitry. Transistor M4 selects when transistor M3 drives bitline signal 90 which signals pixel 10.

A digital imaging device is made up of a plurality of pixels. One problem in using a plurality of semiconductor devices to make the individual pixels is that each of the pixels across the chip can differ. This is particularly seen in the amount of underlying leakage occasioned by the circuitry associated with charging and storing the individual capacitors associated with each pixel circuit. The leakage problem is addressed by compensating for the leakage on a pixel by pixel basis. This is done by conducting a dark picture operation wherein capacitor 70 is charged by $V_{CCT}$ 50 through transistors M1 and M2. Transistor M2 is turned off and the dark-picture reference signal in capacitor 70 is driven out. Through this operation, the device can compensate for individual leakage by each pixel by evaluating each pixel individually. Thus, the steps to, for example, take a picture include taking a picture of the desired image and then taking a dark-picture to calibrate the individual pixels.

FIG. 2 illustrates a schematic layout of a pixel array 100 for a digital imaging device, such as for example, a digital camera. FIG. 2 shows six pixels 110, each pixel being substantially square in shape and having individual pixel circuitry 10, such as the circuitry described in FIG. 1. FIG. 2 also shows pixel circuitry 10 coupled to photosensing structure 20, such as for example, photodiode 20 in FIG. 1. As shown in FIG. 2, the individual pixels 110 that make up the pixel array 100 are formed substantially identically or replicated throughout pixel array 100.

In digital imaging devices, the portion of the pixel that absorbs light is very important because that portion comprehends or interprets the amount of light that hits the pixel. Thus, the larger the photosensing structure, such as a photodiode, is, the better the interpretation or comprehension of the light that hits the pixel.

Prior art structures are limited in the size of the photosensing structure by the amount of additional circuitry needed to operate the chip, such as pixel circuitry 10. Thus, FIG. 2 illustrates the typical configuration of a substantially square pixel having a photosensing structure 20 that consumes about 50 percent of pixel 110 surface area. The other 50 percent of pixel 110 cannot interpret any light that strikes that portion of the pixel.

Photosensing structure 20 is typically formed in the chip substrate. For a semiconductor substrate, such as a silicon substrate, a photosensing structure that is a photodiode is formed commonly in the chip via a P-N junction. The additional circuitry 10 is formed of transistors and contacts to the individual transistors. Thus, the contacts require conductive, generally metal, layers to the devices. These contacts are generally formed of aluminum or an aluminum alloy in a manner similar to other integrated circuit chips by the deposition of multiple conductive layers each separately insulated from one another by a layer of dielectric material.

SUMMARY OF THE INVENTION

A pixel array is disclosed. The pixel array includes a first pixel having side portions and a first pixel layout. The pixel array also includes a second pixel adjacent to the first pixel, the second pixel having a second pixel layout configured to substantially mirror the first pixel layout about one of the side portions of the first pixel.

In a further aspect of the invention, a method of forming a pixel array is disclosed. The method includes providing a semiconductor substrate having a first pixel area and a second pixel area adjacent the first pixel area, forming a photosensing structure in the first pixel area and a second photosensing structure in the second pixel area, and forming a pixel operating circuit in a portion of the first pixel area and in a portion of the second pixel area, the pixel operating circuit having a signal line common to the first, the signal line coupled to both the first and the second photosensing structures.

Additional features and benefits of the invention will become apparent from the detailed description, figures, and claims set forth below.

BRIEF DESCRIPTION OF THE DRAWINGS

FIG. 9 is a schematic top view of the pair of pixels of FIG. 6 showing the further processing step of forming contacts to the first layer of conductive material and patterning a second layer of conductive material over the pixels.

DETAILED DESCRIPTION OF THE INVENTION

The invention relates to a pixel array and a method of forming a pixel array. The invention maximizes the light absorbing area of an individual pixel by reducing the amount of surface area required by the non-light absorbing circuitry of a pixel. In one embodiment, the invention achieves this result by mirroring of pixels. The mirroring of pixels facilitates the use of fewer conductive, for example, metal layers, required for accessing chip circuitry. This allows the pixel to be fabricated using less complicated manufacturing processes by the use of, for example, two metal layers instead of four metal layers as in many prior art structures.

In the following detailed description, specific details are described or referenced with respect to specific pixel arrays in order to completely describe the invention. It is to be appreciated that the specific details described or referenced need not be specifically adhered to in order to practice the invention. In other instances, specific processes, materials, and techniques that would be understood by a person of ordinary skill in the art are not set forth so as not to obscure the description of the invention.

Figure 1:
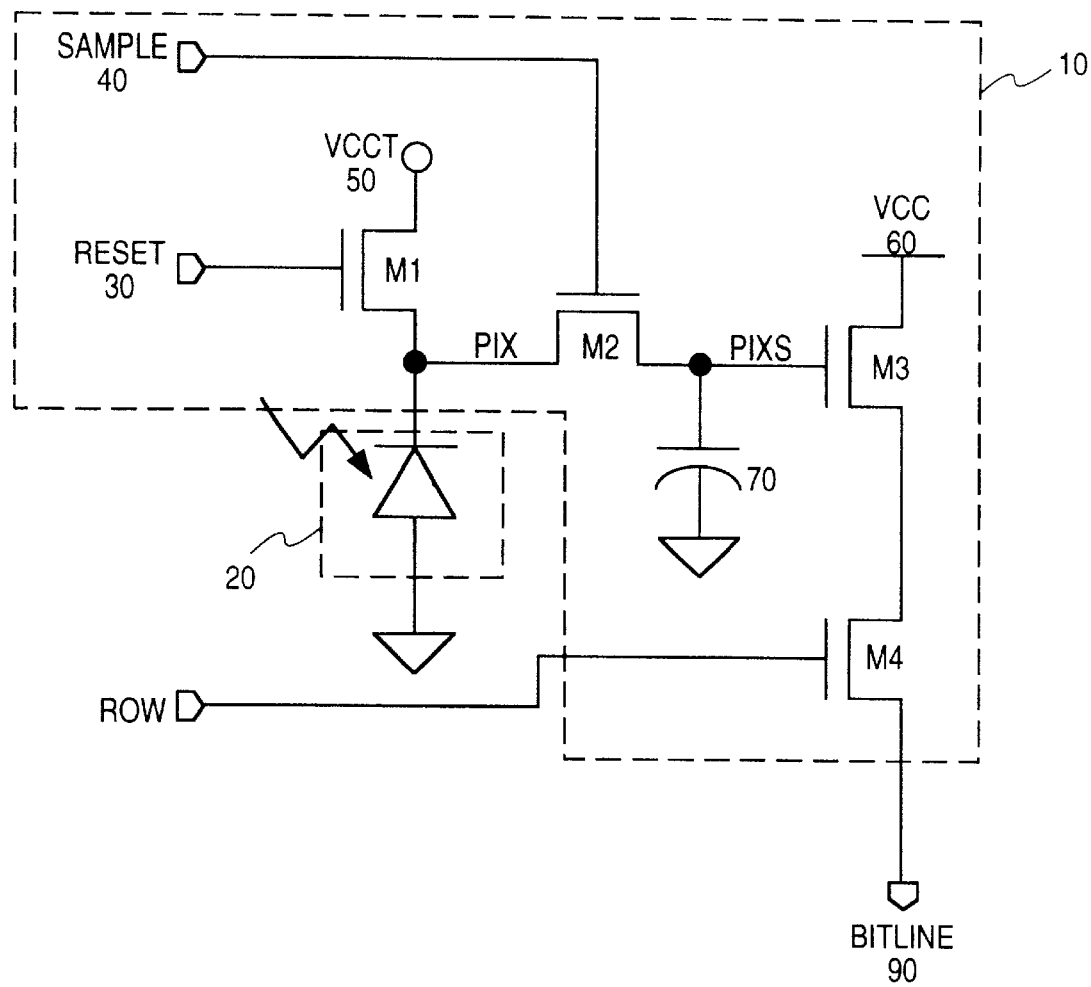
FIG. 1 is a circuit diagram of a prior art imaging pixel.
Figure 2:
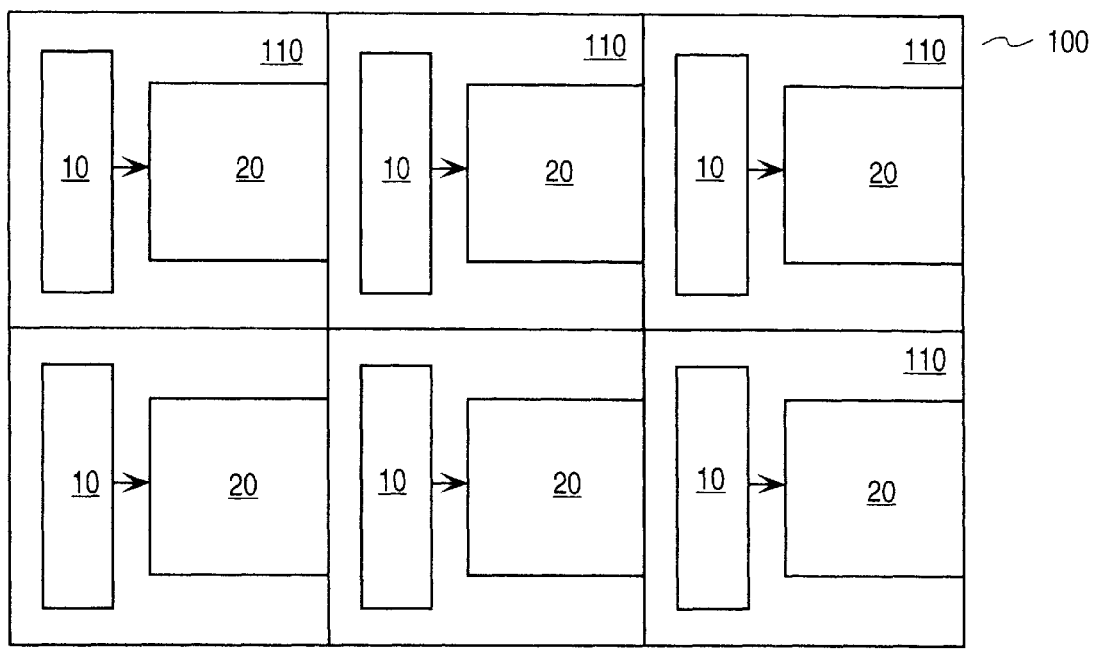
FIG. 2 is a schematic block diagram of an array of prior art pixel structures.
Figure 3:
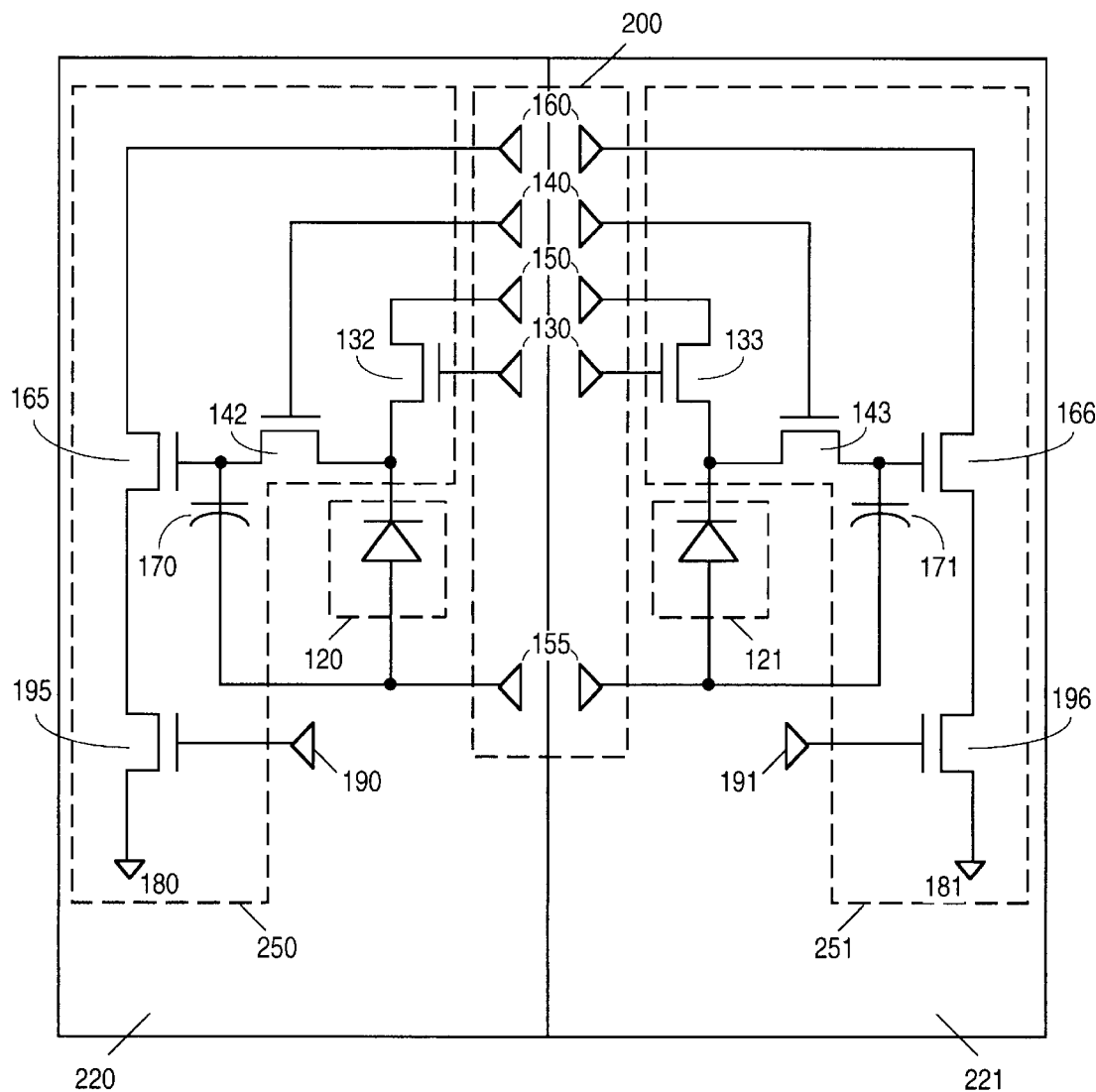
FIG. 3 is a circuit diagram of an imaging device in accordance with an embodiment of the invention.

Prior art pixels were generally square and repeated identical circuitry throughout as described above with reference to FIGS. 1 and 2. The invention relates to a different orientation wherein, in one embodiment, adjacent pixels of a pixel array share many of the necessary pixel circuitry. In this embodiment, the pixels are not square. FIG. 3 illustrates a circuit diagram of an embodiment of the invention wherein two adjacent pixels share pixel circuitry. FIG. 3 shows adjacent pixels 220 and 221. Adjacent pixels 220 and 221 share signal lines 200. In this embodiment, shared signal lines 200 include signal lines $V_{CC}$ 160, $V_{CC}$RESET 150, and $V_{SS}$ 155.

The following discussion illustrates the operation of the circuitry associated with pixels 220 and 221 illustrated in FIG. 3. In one embodiment, capacitors 170 and 171, respectively, are charged to, for example, 5 volts by $V_{CC}$RESET 150. First, SAMPLE 140 is activated and photosensing structures, e.g., photodiodes, 120 and 121 are exposed for a period of time as determined by the activation of SAMPLE signal 140. The signal generated by photodiode 120 and 121 is driven off pixel 220 or 221, respectively, by $V_{CC}$ 160 by addressing row 180 or 181 in accordance with SAMPLE 140 exposure. Second, the pixel is calibrated by activating RESET 130 for a particular pixel by individually addressing row 180 and 181 and bit lines 190 and 191, respectively, in a no-light setting and the leakage of capacitor 170 and 172, is determined. The signal generated by photodiode 120 and 121 is driven off pixel 220 or 221, respectively, by $V_{CC}$ 160 by addressing row 180 or 181 in accordance with SAMPLE 140 exposure time equal to zero, which corresponds to no light.

Figure 4:
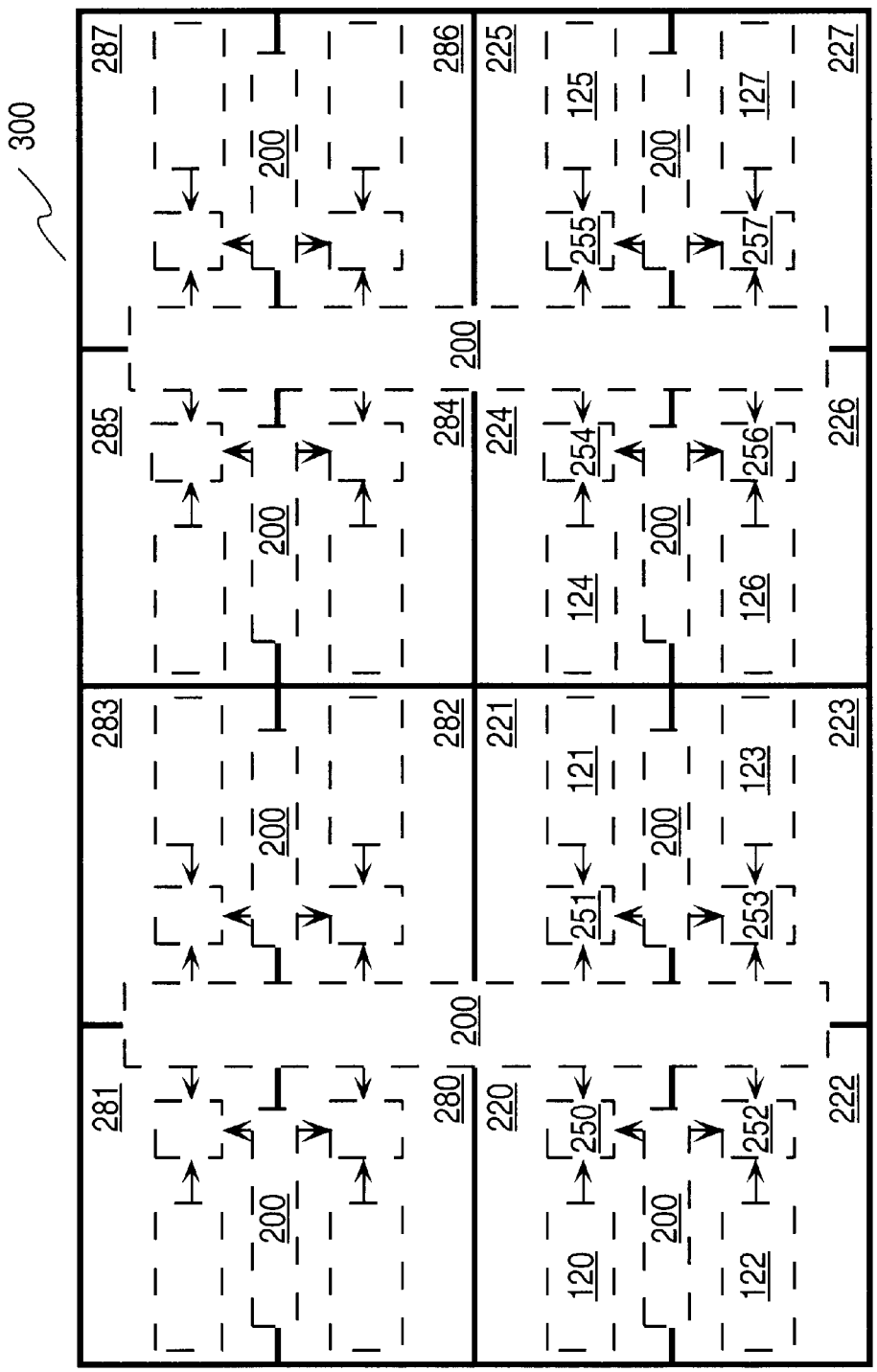
FIG. 4 is a schematic block diagram of an array of pixels in accordance with an embodiment of the invention.
Figure 5:
FIG. 5 is a schematic illustration of the orientation of individual pixels in a pixel array.

FIG. 4 illustrates a block diagram of a pixel array utilizing shared circuitry, e.g., shared signal lines, in accordance with the invention. FIG. 4 shows pixels 220 and 221 having photosensing structures, e.g., photodiodes 120 and 121, respectively. Individual pixels 220 and 221 share signal lines 200 as described above with reference to FIG. 3. Thus, FIG. 4 shows that photosensing structures 120 and 121, respectively, can be larger for an individual pixel since the pixel does not require separate signal lines but can share signal lines with an adjacent pixel. Thus, "sharing" means, for example, fewer conductive lines must be placed in each pixel area to occupy space in the pixel areas. In one embodiment, it has been determined that photosensing structures 120 and 121 using shared signal lines 200 can occupy an 11.6 percent greater photosensing surface area than prior art structures configured as described above with reference to FIGS. 1 and 2. FIG. 4 shows shared signal lines 200 common to both pixel 220 and pixel 221. FIG. 5 also shows individual circuitry 250 and 251, respectively, retained by each pixel. With reference to FIG. 4, individual circuitry 250 and 251 is, for example, FIG. 3 devices such as capacitors 170 and 172, SAMPLE transistors 142 and 143, RESET transistors 132 and 133, and addressing transistors 165 and 166 and 195 and 196. The conductive lines to SAMPLE transistors 142 and 143, RESET transistors 132 and 133, and addressing row 180, 181 and bit 190, 191 lines are shared. In other words, a common conductive path is used between adjacent pixels 220 and 221 for certain signal lines to interface the signal lines to the adjacent pixels.

FIGS. 3 and 4 illustrate a further aspect of the invention. Individual pixel circuits 220 and 221 are essentially mirror images of one another about their shared axis. This is to be contrasted with prior art pixel structures, such as illustrated in FIG. 2, wherein each pixel is fabricated identically, i.e., identical layout orientation, as every other pixel, including its neighbor. The mirroring of pixels 220 and 221 about a shared axis facilitates the sharing of signal lines 200. The sharing of pixel circuitry 200 reduces the area required for non-photosensing structures in individual pixels 220 and 221.

As illustrated in FIG. 4, pixels 220 and 221 are mirror images of one another. This is also true of adjacent pixels 220 and 222. Adjacent pixels 220 and 222 are mirrored about their common axis. In this manner, pixels 220 and 222 can also share signal lines 200. In one embodiment, shared signal lines 200 between pixels 220 and 222 are SAMPLE 140 and RESET 130. This same principle can be applied to pixels 221 and 223 which are mirror images about a shared axis. The mirroring/sharing is also applied between pixel pairs 280–281, and 282–283.

The mirroring/sharing discussed above is repeated with pixel pairs 222–223, 224–225, 224–226, 225–227, 226–227, 280–282, 281–283, 284–286, 284–285, 285–287, and 286–287. FIG. 5 schematically illustrates the orientation of the individual pixels described in FIG. 4. Thus, in one embodiment, the invention contemplates an image sensing device having groups of adjacent pixels that mirror one another in order to share pixel circuitry and reduce the non-photosensing structure area in each pixel.

Figure 6:
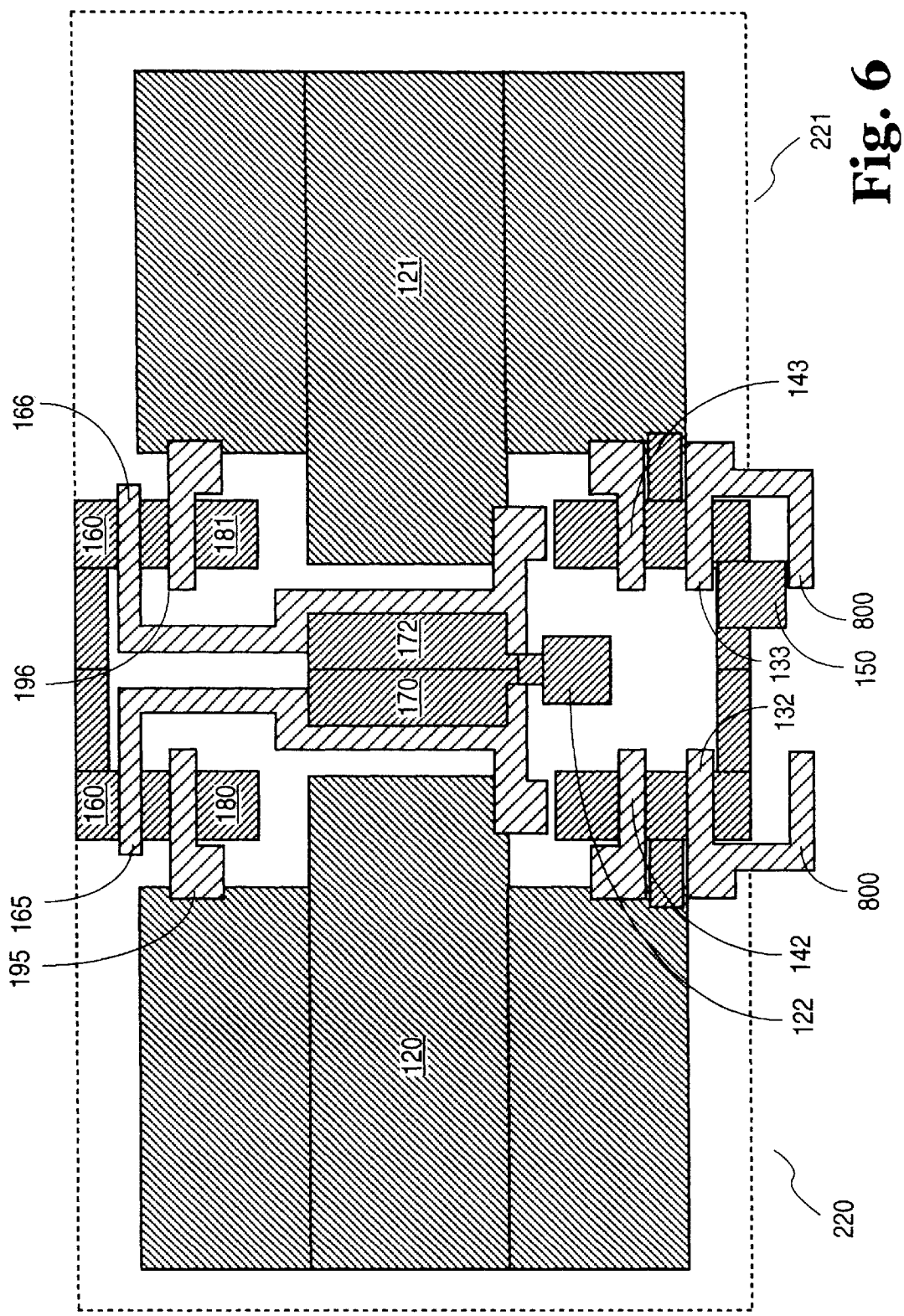
FIG. 6 is a schematic top view of a fabrication layout of a pair of adjacent pixels in accordance with an embodiment of the invention showing photodiode structures, SAMPLE capacitor and individual transistor devices for each pixel.

FIG. 6 shows a top view of a fabrication layout of adjacent pixels 220 and 221. A process flow for forming such a structure is generally described as follows. First, pixel area 220 and 221 are patterned to define transistor regions and photosensing, such as a photodiode, regions. As shown in FIG. 3, in this embodiment, each pixel 220 and 221 contains four transistors, such as for example four n-type transistors. Thus, individual pixel areas are designated for the individual transistor devices. Photosensing structures 120 and 121 are, for example, photodiodes of an n-well to p-substrate P-N junction. Next, a polycrystalline silicon (polysilicon) layer 300 is deposited and patterned to form the individual gates of the transistors. This is followed by an implant of, for example, arsenic to provide negative dopant diffusion (e.g., source and drain) regions 310 for the transistors and photosensing, such as photodiode, regions 120 and 121. In this embodiment, the transistors include RESET transistors 132, 133, SAMPLE transistors 142, 143, bit line transistors 165, 166, and word line transistors 195, 196.

Figure 7:
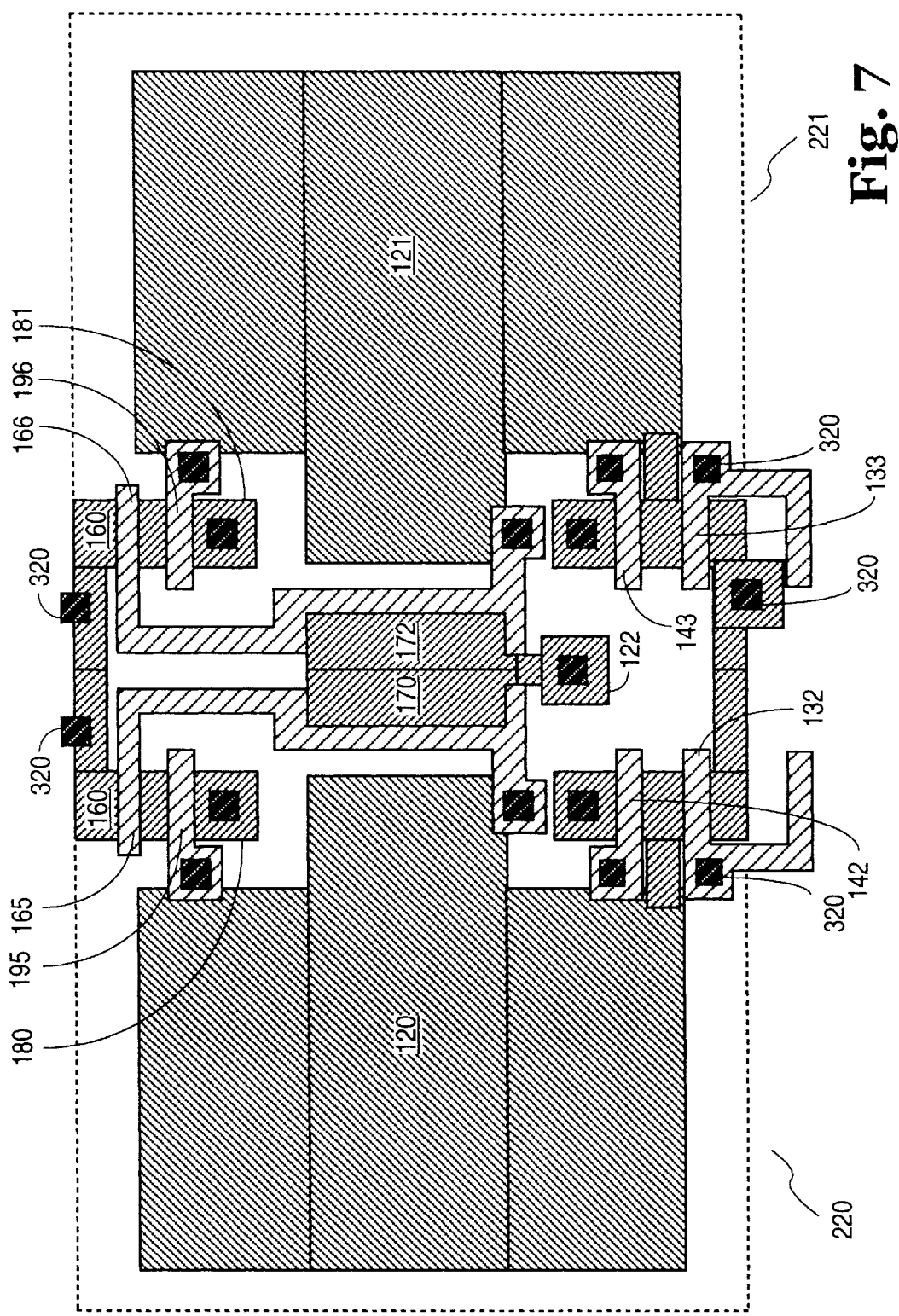
FIG. 7 is a schematic top view of the pair of pixels of FIG. 6 showing the further processing step of forming contacts to the transistor devices and photosensing structures.

Next, as shown in FIG. 7, a first dielectric such as an oxide (e.g., tetraethylorthosilicate (TEOS) is formed, for example, by chemical vapor deposition (CVD), over the transistor regions and openings are formed through the dielectric to contact the gates or diffusion regions of individual transistor devices that are to be connected by a first metal layer. The first dielectric layer is not shown in FIG. 7 in order not to obscure from view the patterning of subsequent conductive layers. Contacts 320 are formed by filling the openings with, for example, tungsten or an adhesion layer of titanium followed by tungsten.

Figure 8:
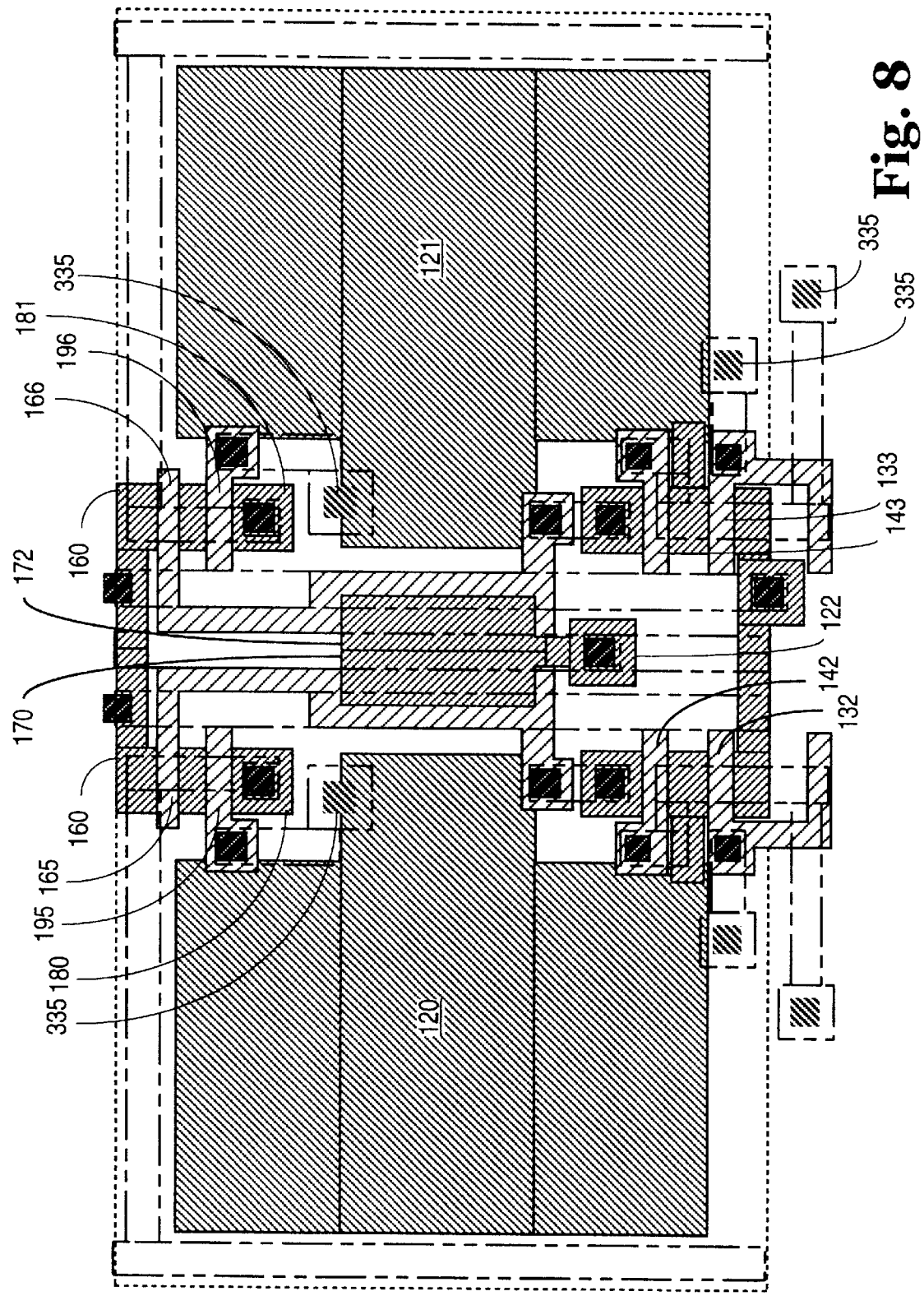
FIG. 8 is a schematic top view of the pair or pixel of FIG. 6 showing the further processing step of patterning a first layer of conductive material over the pixels and vias connecting the first and second metal layers.

Once contacts 320 are formed to the individual devices, FIG. 8 shows the next step of patterning a first conductive layer 330 of, for example, aluminum or an aluminum alloy to the devices. In the embodiment described, first conductive layer 330 is patterned to $V_{CCT}$ 150, $V_{CC}$ 160, $V_{SS}$ 155, and bitlines 180 and 181.

Once the contacts are formed and a conductive layer is deposited and patterned as first conductive layer 330, the device regions are electrically-insulated by a second dielectric layer, such as for example an oxide (e.g., TEOS), deposited by CVD deposition over first conductive layer 330. The second dielectric layer is not shown in order not to obscure the patterning of subsequent material. As shown in FIG. 8, openings or vias 335 are then formed, for example, by etching through the second dielectric layer to first conductive layer 330. In this case, contact openings or vias are made to expose first conductive layer 330 for future contact to a second conductive layer. Vias 335 are then filled with conductive material, such as for example tungsten or an adhesion layer of titanium followed by tungsten.

As shown in FIG. 9, second conductive layer 350 of, for example, aluminum or an aluminum alloy is deposited and patterned as second conductive layer 250. In this embodiment, second conductive layer 250 includes word lines 190 and 191, RESET signal line 130, SAMPLE signal line 150. The device regions are then electrically insulated by a deposition of another dielectric layer, such as for example an oxide (not shown). The final layout of the circuit structure of FIG. 3 (absent dielectric layers) is illustrated in FIG. 9. It is to be appreciated that the designation of elements for the individual conductive lines is not mandatory, but can vary according to the process parameters and layout.

Figure 10A:
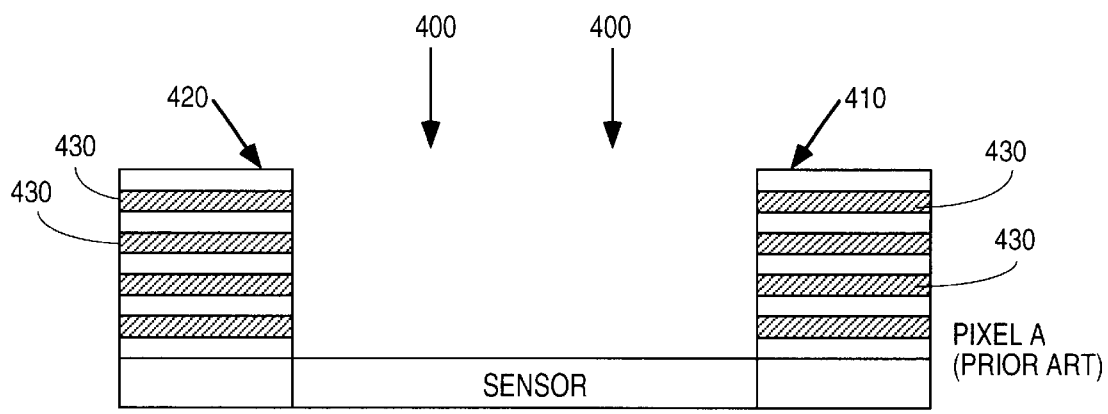
FIGS. 10A and 10B are schematic cross-sectional side views of a prior art pixel structure and a pixel structure in accordance with an embodiment of the invention illustrating the light sensing capabilities of each device.
Figure 10B:
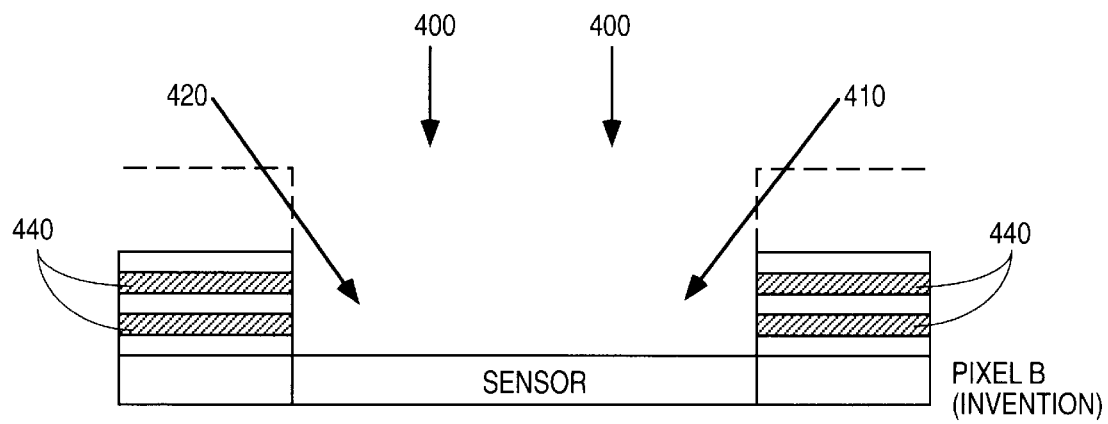

FIG. 10 schematically illustrates a planar side view of a portion of a pixel formed by a prior art process (Pixel A) and a pixel formed as described in FIGS. 6–9 (Pixel B). Pixel A is a common prior art pixel having four conductive lines 430 to operate and drive Pixel A. As can be seen, light rays 400 that are substantially perpendicular and above the sensor region can be sensed by the sensor region. Light rays 410 and 420, approach the sensor region from an angle and that, absent the four insulated conductive lines 430 adjacent the sensor, would be sensed by the sensor. Instead, light rays 410 and 420 are blocked by the insulated conductive lines 430 formed around the sensor to operate Pixel A. This blocking or minimizing of the light available to be sensed by the sensor is referred to as the pixel's "valley effect."

FIG. 10 shows that Pixel B formed by the process of the invention uses only two conductive layers 440 insulated from one another by dielectric layers. This is described in detail with reference to FIGS. 6–9 and the accompanying text. FIG. 10 shows that, in accordance with the invention, by utilizing shared circuitry, the valley effect of the individual pixel device structures fabricated by the invention and represented by Pixel B is significantly reduced over prior art structures, such as Pixel A. Light rays 410 and 420 having an angle of incidence that was blocked by the insulated conductive lines of Pixel A, can now be sensed by the sensor of Pixel B.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A pixel array comprising:
   a first pixel having a first pixel area including a first pixel orientation;
   a second pixel adjacent said first pixel, said second pixel having a second pixel area and a second pixel orientation, said second pixel orientation configured in said array to substantially mirror said first pixel orientation about an axis between said first pixel and said second pixel;
   first addressing circuitry coupled to said first pixel and different second addressing circuitry coupled to said second pixel;
   a pixel operating circuit coupled to each of a sampling element for the first pixel and a sampling element for the second pixel, said pixel operating circuit adapted to be shared between said first pixel and said second pixel; and
   reset circuitry coupled to each of said first pixel and said second pixel, said reset circuitry adapted to be shared between said first pixel and said second pixel.

2. The pixel array of claim 1, said pixel array comprised of a third pixel adjacent said first pixel, said third pixel having a third pixel area and a third pixel orientation, said third pixel orientation configured in said array to substantially mirror said first pixel orientation about an axis between said first pixel and said third pixel.

3. The pixel array of claim 1, said first pixel including a first photosensing structure and said second pixel including a second photosensing structure, said pixel operating circuit coupled to said first photosensing structure and said second photosensing structure.

4. An apparatus comprising:
   a grid of four pixels each comprising addressing circuitry and each having a pixel orientation,
   a second pixel orientation configured in said grid to substantially mirror a first pixel orientation about a first axis between said first pixel and said second pixel, a third pixel orientation configured in said grid to substantially mirror said first pixel orientation about a second axis between said first pixel and said third pixel, a fourth pixel orientation configured in said grid to substantially mirror said second pixel orientation about a third axis between said second pixel and said fourth pixel;

a pixel operating circuit, said pixel operating circuit including signal lines adapted to be shared between said first pixel and said second pixel; and reset circuitry coupled to each of said first pixel and said second pixel, said reset circuitry adapted to be shared between said first pixel and said second pixel.

5. The pixel array of claim 4, said first pixel including a first photosensing structure, said second pixel including a second photosensing structure, said third pixel including a third photosensing structure, said fourth pixel including a fourth photosensing structure, said pixel operating circuit coupled to said first photosensing structure and said second photosensing structure.

6. A method of forming a pixel array, comprising:

providing a semiconductor substrate having a first pixel area and a second pixel area adjacent said first pixel area;

forming a first photosensing structure in said first pixel area of said substrate;

forming a second photosensing structure in said second pixel area of said substrate;

forming a pixel operating circuit in a portion of said first pixel area and in a portion of said second pixel area, said pixel operating circuit comprising a charging device coupled to said photosensing structures to charge said photosensing structures to a predetermined value, a discharge device coupled to at least one of said photosensing structures to discharge said photosensing structures in response to a light signal, and a sample device coupled to said discharge device to regulate the discharge of said charge signal of said photosensing structures; and forming reset circuitry in a portion of said first pixel area and in a portion of said second pixel area, said reset circuitry coupled to said photosensing structures and adapted to be shared between said first pixel said second pixel.

7. The method of claim 6, said pixel operating circuit comprising a driver device coupled to said discharge device to drive said charge signal.

8. The method of claim 6, said pixel operating circuit including a plurality of transistor devices formed on said substrate in said first pixel area and said second pixel area, wherein forming said pixel operating circuit comprises:

forming a first insulated conductive layer and a second insulated conductive layer over at least one of said first pixel area and said second pixel area; and patterning contacts to each of said plurality of transistor devices, said contacts coupled to one of said first conductive layer and said second conductive layer.

* * * * *

UNITED STATES PATENT AND TRADEMARK OFFICE
CERTIFICATE OF CORRECTION

PATENT NO. : 6,246,042 B1
DATED : June 12, 2001
INVENTOR(S) : Szydlowski

Page 1 of 1

It is certified that error appears in the above-identified patent and that said Letters Patent is hereby corrected as shown below:

Column 4,
Line 24, delete "FIG. 5" and insert -- FIG. 4 --.

Column 8,
Line 14, delete "first pixel said second" and insert -- first pixel and said second --.

Signed and Sealed this

Seventh Day of May, 2002

Attest:

Attesting Officer

JAMES E. ROGAN
*Director of the United States Patent and Trademark Office*